US011469312B2

(12) United States Patent
Quddus et al.

(10) Patent No.: US 11,469,312 B2
(45) Date of Patent: Oct. 11, 2022

(54) REMOTE CONTACTS FOR A TRENCH SEMICONDUCTOR DEVICE AND METHODS OF MANUFACTURING SEMICONDUCTOR DEVICES

(71) Applicant: SEMICONDUCTOR COMPONENTS INDUSTRIES, LLC, Phoenix, AZ (US)

(72) Inventors: Mohammed T. Quddus, Chandler, AZ (US); Mihir Mudholkar, Phoenix, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 162 days.

(21) Appl. No.: 16/841,167

(22) Filed: Apr. 6, 2020

(65) Prior Publication Data

US 2021/0313453 A1    Oct. 7, 2021

(51) Int. Cl.
*H01L 29/66* (2006.01)
*H01L 29/872* (2006.01)
(Continued)

(52) U.S. Cl.
CPC .. *H01L 29/66613* (2013.01); *H01L 21/76205* (2013.01); *H01L 29/4236* (2013.01); *H01L 29/8128* (2013.01); *H01L 29/8725* (2013.01)

(58) Field of Classification Search
CPC ............. H01L 29/7813; H01L 29/7825; H01L 29/66734; H01L 21/8238–823892;
(Continued)

(56) References Cited

U.S. PATENT DOCUMENTS 7,696,540 B2    4/2010 Francis et al.
2007/0059887 A1*    3/2007 Poelzl ................ H01L 29/7813
438/270
(Continued)

OTHER PUBLICATIONS

Mihir Mudholkar et al., "A Novel Trench Schottky Rectifier Structure with Controlled Conductivity Modulation," Proceedings of the 26th International Symposium on Power Semiconductor Devices & IC's, Jun. 15-19, 2014.

*Primary Examiner* — Moin M Rahman
(74) *Attorney, Agent, or Firm* — Kevin B. Jackson

(57) ABSTRACT

A semiconductor device structure comprises a region of semiconductor material comprising a first conductivity type, a first major surface, and a second major surface opposite to the first major surface. A first trench gate structure includes a first trench extending from the first major surface into the region of semiconductor material, a first dielectric structure is over sidewall surfaces and a portion of a lower surface of the first trench, wherein the first dielectric structure comprises a first opening adjacent to the lower surface of the first trench, a first recessed contact extends through the first opening, and a first contact region is over the first recessed contact within the first trench, wherein the first recessed contact and the first contact region comprise different materials. A first doped region comprising a second dopant conductivity type opposite to the first conductivity type is in the region of semiconductor material and is spaced apart from the first major surface and below the first trench. A gate contact region is in the region of semiconductor material and is electrically connected to the first doped region.

20 Claims, 10 Drawing Sheets

(51) Int. Cl.
  *H01L 21/762* (2006.01)
  *H01L 29/812* (2006.01)
  *H01L 29/423* (2006.01)

(58) Field of Classification Search
  CPC . H01L 27/092–0928; H01L 29/04–045; H01L 29/16–1608; H01L 29/18–185; H01L 29/22–2206; H01L 29/36–365; H01L 21/823493; H01L 21/823885; H01L 21/823412; H01L 29/66522; H01L 29/20–2006; H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 29/66613; H01L 21/76205; H01L 29/4236; H01L 29/8128; H01L 29/8725; H01L 29/0692; H01L 29/47; H01L 29/0619; H01L 29/872; H01L 29/1608; H01L 29/2003; H01L 29/475
  See application file for complete search history.

(56) References Cited

U.S. PATENT DOCUMENTS

2009/0189218 A1\* 7/2009 Pan ............... H01L 29/7813
  438/270
2013/0200451 A1   8/2013 Yilmaz et al.

\* cited by examiner

REMOTE CONTACTS FOR A TRENCH SEMICONDUCTOR DEVICE AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, decreased reliability, relatively low performance, or dimensions that are too large. Further limitations and disadvantages of conventional and traditional approaches will become apparent to one of skill in the art, through comparison of such approaches with the present disclosure and reference to the drawings.

Figure 1:
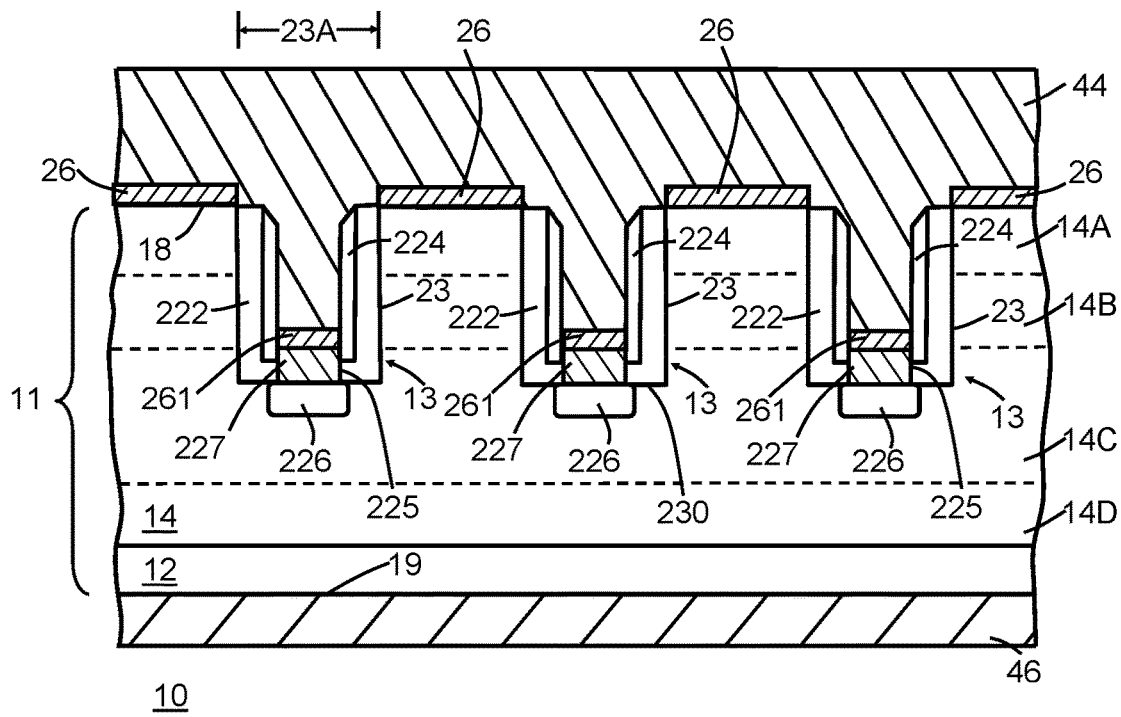
FIG. 1 illustrates a partial cross-sectional view of a semiconductor device with a trench gate structure in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

In certain high voltage structures, such as ultrafast, PiN, and JBS rectifiers, conductivity modulation can be achieved by minority carrier injection in the forward direction or on state, which can lower the forward voltage (Vf). However, when such devices switch to the off state, additional recovery time is required to remove the stored charge resulting from the minority carrier injection. In general, the larger the stored charge (Qrr), the longer the recovery time ($t_{rr}$) to remove the stored charge. To compensate, previous devices have used certain lifetime control techniques, such as electron beam irradiation or platinum doping. However, such processes can result in what is termed as snappy reverse characteristics, which can be detrimental to system performance. Additionally, such lifetime control techniques require additional process steps that add manufacturing cost and increased cycle time, and present potential contamination issues within wafer fabrication facilities.

In general, the present examples relate to a semiconductor device and methods having improved control of conductivity modulation within the semiconductor device to improve, among other things, switching performance. The semiconductor device includes an active device region with remote gate contact regions disposed in the active device region. The remote gate contact regions are configured to control the amount of minor carrier injection thereby improving switching characteristics in a cost effect manner. The remote gate contacts are used in combination with several different trench gate structure examples to provide additional degrees of design freedom for controlling conductivity modulation. In some examples, additional lifetime control techniques can be included with the present examples, including, for example, electron beam irradiation or platinum doping. For example, additional lifetime control can be used for higher voltage devices (e.g., greater than about 300 volts) to achieve optimal tradeoffs between Vf and Qrr.

More particularly, in one example, a semiconductor device structure comprises a region of semiconductor material comprising a first conductivity type, a first major surface, and a second major surface opposite to the first major surface. A first trench gate structure includes a first trench extending from the first major surface into the region of semiconductor material, a first dielectric structure is over sidewall surfaces and a portion of a lower surface of the first trench, wherein the first dielectric structure comprises a first opening adjacent to the lower surface of the first trench, a first recessed contact extends through the first opening, and a first contact region is over the first recessed contact within the first trench, wherein the first recessed contact and the first contact region comprise different materials. A first doped region comprising a second dopant conductivity type opposite to the first conductivity type is in the region of semiconductor material and is spaced apart from the first major surface and below the first trench. A gate contact region is in the region of semiconductor material and is electrically connected to the first doped region.

In an example, a semiconductor device structure comprises a region of semiconductor material comprising an active region, a first conductivity type, a first major surface, and a second major surface opposite to the first major surface. Trench gate structures comprise trenches extending from the first major surface into the region of semiconductor material, first dielectric structures are over sidewall surfaces and a portion of a lower surface of each trench, wherein each first dielectric structure comprises an opening adjacent to the lower surface, recessed contacts extend through the openings, and first contact regions are over the recessed contacts within the trenches, wherein the recessed contacts and the first contact regions comprise different materials. Doped regions comprising a second dopant conductivity type opposite to the first conductivity type are in the region of semiconductor material spaced apart from the first major surface and below the trenches. Gate contact regions are in the active region of region of semiconductor material electrically coupled to the doped regions, wherein first portions of the recessed contacts are electrically decoupled from the doped regions.

In an example, a method for forming semiconductor device structure comprises providing a region of semiconductor material comprising an active region, a first conductivity type, a first major surface, and a second major surface opposite to the first major surface. The method includes providing trench gate structures comprising trenches extending from the first major surface into the region of semiconductor material, first dielectric structures over sidewall surfaces and a portion of a lower surface of each trench, wherein each first dielectric structure comprises an opening adjacent to the lower surface, recessed contacts extending through the openings, and first contact regions over the recessed contacts within the trenches, wherein the recessed contacts and the first contact regions comprise different materials. The method includes providing doped regions comprising a second dopant conductivity type opposite to the first conductivity type are in the region of semiconductor material spaced apart from the first major surface and below the trenches. The method includes providing gate contact regions in the active region of region of semiconductor material electrically coupled to the doped regions, wherein first portions of the recessed contacts are electrically decoupled from the doped regions.

FIG. 1 illustrates an enlarged partial cross-sectional view of an electronic device 10, a semiconductor device 10, or a trench Schottky rectifier 10 having a trench gate structure 13 in accordance with the present description. In some examples, semiconductor device 10 comprises a region of semiconductor material 11 having a major surface 18 and an opposing major surface 19. Region of semiconductor material 11 can include a bulk semiconductor substrate 12, such as an N-type conductivity silicon substrate having a resistivity in a range from about 0.001 ohm-cm to about 0.005 ohm-cm. By way of example, substrate 12 can be doped with phosphorous, arsenic, or antimony. In other examples, substrate 12 can be a P-type conductivity silicon substrate having a similar resistivity range. The cross-section of FIG. 1 can be, for example, an active area of semiconductor device 10.

In some examples, region of semiconductor material 11 further includes a semiconductor layer 14, doped region 14, doped layer 14, or doped layers 14, which can be formed in, on, or overlying substrate 12. In one example, semiconductor layer 14 can be an N-type conductivity region or layer when substrate 12 is N-type conductivity, and can be formed using epitaxial growth techniques, ion implantation and diffusion techniques, or other techniques as known to one of ordinary skill in the art. In other examples, semiconductor layer 14 can be P-type conductivity. In one example, semiconductor layer 14 includes major surface 18 of region of semiconductor material 11. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to one of ordinary skill in the art.

In some examples, semiconductor layer 14 has a dopant concentration that is less than the dopant concentration of substrate 12. The dopant concentration and/or dopant profile of semiconductor layer 14 can be selected to provide a desired breakdown voltage and a desired forward voltage drop for semiconductor device 10. In some examples, semiconductor layer 14 can have a dopant profile that changes over its depth inward from major surface 18. Such profiles can include, but are not limited to profiles that have a first dopant concentration in a region 14A of semiconductor layer 14 proximate to major surface 18, a second dopant concentration in a region 14B at a first depth from major surface 18, a third dopant concentration in a region 14C at a second depth from major surface 18, and a fourth dopant concentration in a region 14D at a third depth from major surface 18. In some examples, the second dopant concentration can be greater than the first, third, and fourth dopant concentrations. In some examples, the first dopant concentration can be greater than the third dopant concentration. In some examples, the fourth dopant concentration can be greater than the third dopant concentration. In other examples, one or more of the first, second, third, or fourth dopant concentrations can change over the depth of their respective regions 14A-14D. Such changes can include linear and non-linear profiles over the respective regions 14A-14D.

In the present example, trench gate structures 13 can include active trenches 23, dielectric structure 222, dielectric spacers 224, recessed contacts 227, contact regions 261, and conductive layer 44. In accordance with the present description, semiconductor device 10 includes doped region 226 disposed below or proximate to a lower surface of active trench 23. In some examples, recessed contacts 227 are electrically connected to doped regions 226.

Active trenches 23 extend from major surface 18 into portions of region of semiconductor material 11. In some examples, active trenches 23 can be laterally spaced apart from each other with other portions of region of semiconductor material 11 interposed between adjacent active trenches 23. Such other portions of region of semiconductor material 11 can be referred to as mesa regions, which can be bounded on at least two sides by trench gate structures 13.

In one example, active trenches 23 can extend from major surface 18 into semiconductor layer 14 towards semiconductor substrate 12. In some examples, active trenches 23 can extend into semiconductor substrate 12. In other examples, active trenches 23 can terminate within semiconductor layer 14 thereby leaving a portion of semiconductor layer 14 interposed between lower surfaces of active trenches 23 and semiconductor substrate 12. In the present example, active trenches 23 have a width 23A proximate to major surface 18 in a range from approximately 0.1 microns to approximately 2.0 microns. In addition, active trenches 23 can have the same or different depths with respect to each other.

Active trenches 23 can be formed using photolithographic masking and material removal steps. For example, active trenches 23 can be etched using plasma etching techniques with a fluorocarbon chemistry or a fluorinated chemistry (for example, $SF_6/O_2$) or other chemistries or removal techniques as known to one of ordinary skill in the art. Wet etchants can also be used to form active trenches 23 alone or in combination with other removal techniques as known to one of ordinary skill in the art.

Dielectric structure 222, which can also be referred to as a dielectric region or a gate dielectric layer, is disposed adjoining sidewall surfaces and lower surfaces of active trenches 23. Dielectric structure 222 defines surfaces of active trenches 23 including a lower surface 230 of active trenches 23. It is understood that lower surfaces 230 may not be flat, and instead, can have other shapes including, but not limited to curved, rounded, partially-curved, or partially-rounded shapes. In one example, dielectric structure 222 comprises a combination of dry and wet oxides having a thickness in a range from approximately 0.01 microns to approximately 1.5 microns. In other examples, dielectric structure 222 can comprise a nitride, tantalum pentoxide, titanium dioxide, barium strontium titanate, high k dielectric materials, combinations thereof, or other related or equivalent materials known to one of ordinary skill in the art. Dielectric structure 222 can comprise more than one layer with each layer comprising the same or different materials provided by the same or different processes.

In some examples, dielectric spacers 224 can be disposed adjoining sidewall surfaces and a portions of lower surfaces of dielectric structure 222. An opening 225 extends between dielectric spacers 224 and through a portion of dielectric structure 222 to provide passage to a portion of semiconductor layer 14. Dielectric spacers 224 can comprise oxides, nitrides, and other materials as known to one of ordinary skill in the art, or combinations thereof. Dielectric spacers 224 can be formed using plasma-enhanced chemical vapor deposition (PECVD) processes or low pressure chemical vapor deposition (LPCVD) processes and removal techniques. Such removal techniques can include anisotropic etching techniques.

Doped regions 226 are disposed adjacent to lower surfaces 230 of active trenches 23. In some examples, doped regions 226 comprise a P-type conductivity when semiconductor layer 14 comprises N-type conductivity. In some examples, doped regions 226 can be formed using ion implantation and anneal processes, chemical vapor deposition processes, diffusion processes, spin-on doping processes, or other processes as known to one of ordinary skill in the art. In the present example, doped regions 226 can extend at least partially laterally along the lateral dimension of active trenches 23. In some examples, doped regions 226 under each active trench 23 are connected together within semiconductor layer 14 or external to semiconductor layer 14. In other examples, doped region 226 can be discrete striped regions. In some examples, doped regions 226 can be laterally inset with respect to the side surfaces of active trenches 23 as illustrated in FIG. 1.

Recessed contacts 227, which can also be referred to as pedestal contacts, are disposed adjacent to the lower surface of active trenches 23 and are connected to doped regions 226 through opening 225. In some examples, recessed contacts 227 comprise a doped polycrystalline semiconductor material, such as doped polysilicon. In some examples, recessed contacts 227 have the same conductivity type as doped region 226 (P-type conductivity in the present example). In some examples, recessed contacts 227 are undoped or lightly doped P-type conductivity. In some examples, undoped refers to an as formed layer that is not intentionally exposed to dopants during the deposition process or after the layer is formed. In some examples, undoped means an intrinsic semiconductor layer. In some examples, lightly doped means a dopant concentration less than about $1.0 \times 10^{18}$ atoms/cm$^3$. In some examples, lightly doped means a dopant concentration less than about $1.0 \times 10^{17}$ atoms/cm$^3$. In some examples, lightly doped means a dopant concentration less than about $1.0 \times 10^{16}$ atoms/cm$^3$. In some examples, lightly doped means a dopant concentration that provides a non-ohmic contact. Recessed contacts 227 can be formed using CVD, LPCVD, PECVD, atomic layer deposition (ALD), or other deposition processes as known to one of ordinary skill in the art, and can be doped in-situ or separately using, for example, ion implantation and anneal processes. The deposited material can then be etched back to leave a portion of the deposited material within active trenches 23 to provide recessed contacts 227.

In some examples, contact regions 261 comprise a conductive material, such as one or more metals. In the present example, semiconductor device 10 further comprises contact regions 26 disposed adjacent to major surface 18 between trench gate structures 13. In some examples, contact regions 26 comprise a material configured to provide a Schottky barrier structure with region of semiconductor material 11. Such materials can include platinum, nickel-platinum (with various platinum atomic weight percentages, for example, from approximately 1% to approximately 80%, with 5% being selected in some examples), titanium, titanium-tungsten, chromium, and/or other materials capable of forming a Schottky barrier as known to those skilled in the art.

In some example, contact regions 261 are provided within active trenches 23 adjacent to recessed contacts 227. In some examples, contact regions 261 can comprise a material configured to provide a Schottky barrier structure with recessed contacts 227, and can be similar or different materials than contact regions 26. Sputtering, evaporation, CVD, or other processes as known to one of ordinary skill in the art can be used to form contact regions 26 and 261. The deposited materials can be annealed to form a silicide and any unreacted material can be removed to provide contact regions 26 or 261.

Recessed contacts 227 provide a benefit because recessed contacts 227 move contact regions 261 upward and away from the lower surface of active trenches 23 adjacent to doped regions 226 thereby reducing edge effects, such as leakage effects. In addition, the dopant concentration of recessed contacts 227 can provide a degree of design freedom in controlling conductivity modulation of semiconductor device 10.

In some examples, conductive layer 44 is disposed within active trenches 23 and is connected to doped regions 226 through contact regions 261 and recessed contacts 227. In some examples, conductive layer 44 extends to overlap contact regions 26 as generally illustrated in FIG. 1 to provide an anode contact for semiconductor device 10. A conductive layer 46 and be provided overlying major surface 19 and can be configured as cathode contact. Conductive layers 44 and 46 can be configured to provide electrical connection between semiconductor device 10 and a next level of assembly, such as a semiconductor package structure or printed circuit board.

In some examples, conductive layer 44 can be titanium/titanium-nitride/aluminum-copper or other related or equivalent materials known to one of ordinary skill in the art. In some examples, conductive layer 46 can be a solderable metal structure such as titanium-nickel-silver, chromium-nickel-gold, or other related or equivalent materials known by those skilled in the art. Conductive layers 44 and 46 can be formed using sputtering, evaporation, plating, CVD, or other deposition techniques. Conductive layer 44 can be patterned using, for example, photolithographic and etch techniques.

Figure 3:
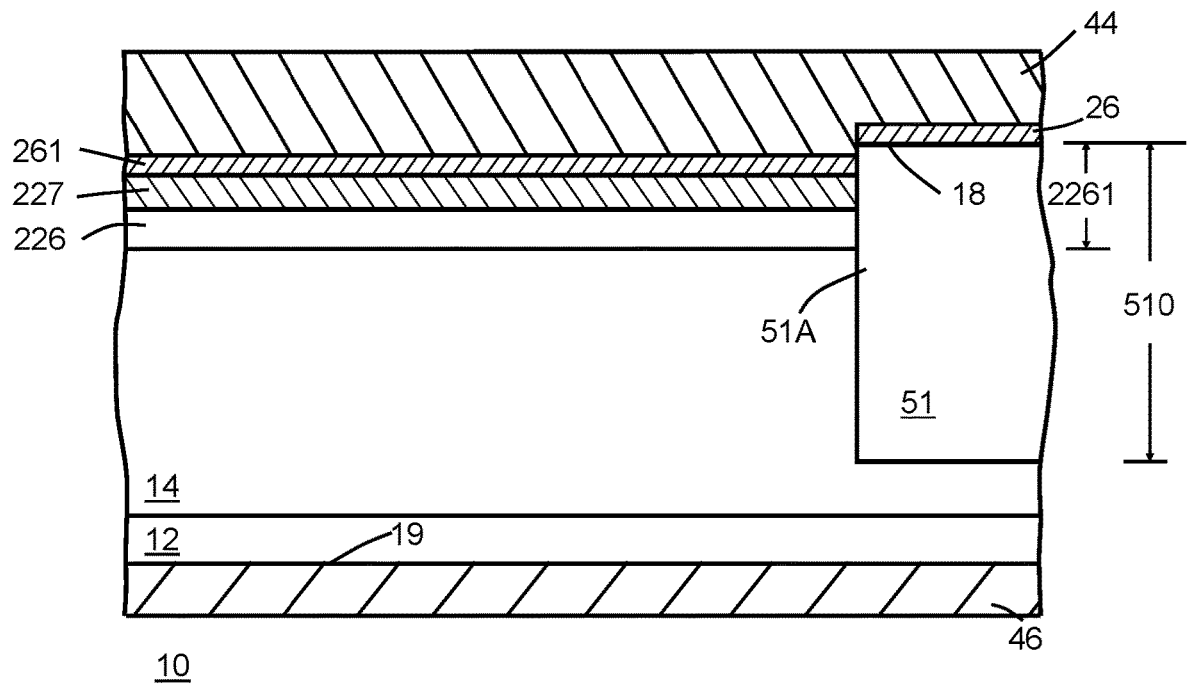
FIG. 3 illustrates a partial cross-sectional view of the semiconductor device of FIG. 2 taken along reference line 3A-3B.
Figure 2:
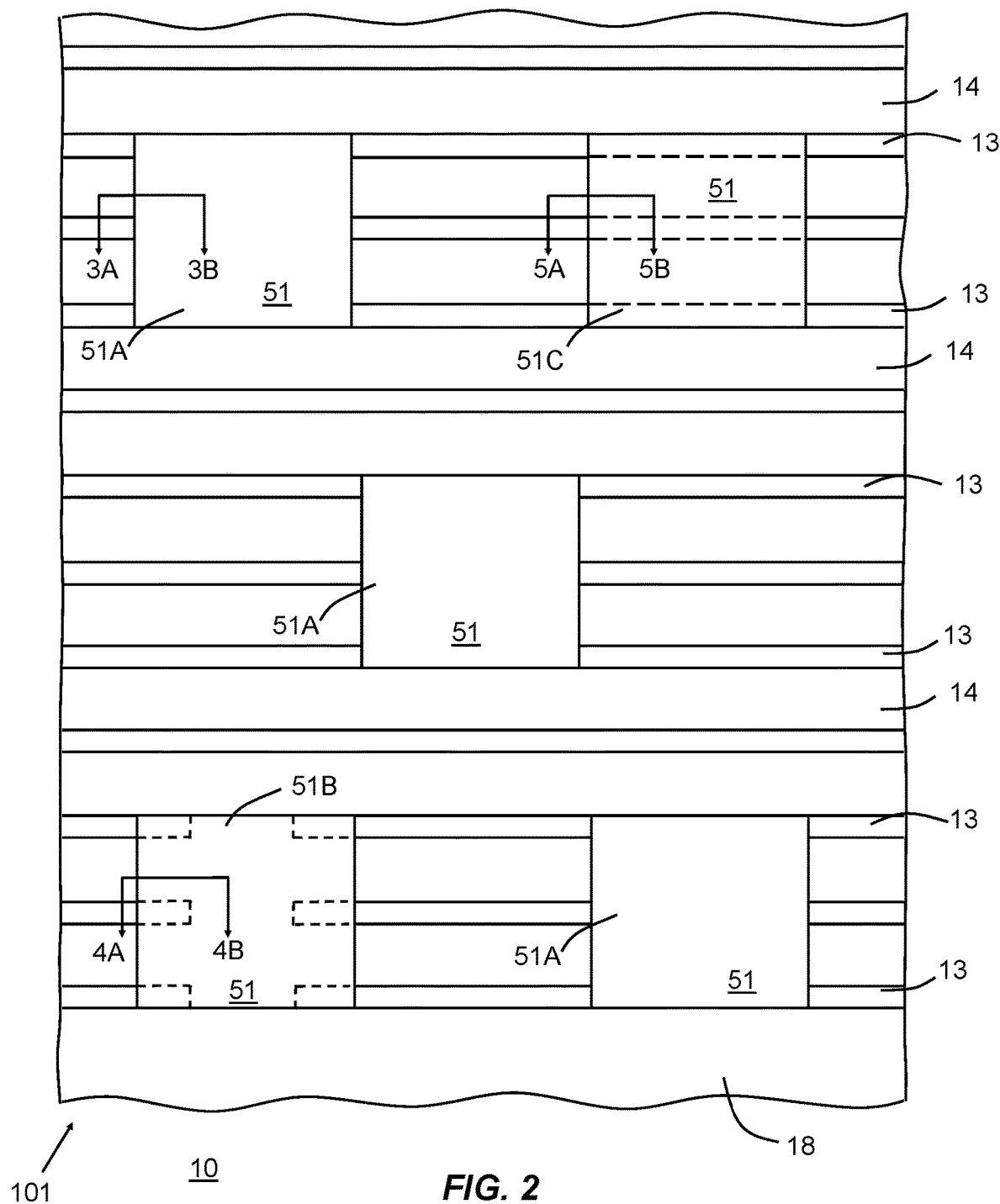
FIG. 2 illustrates a top plan view of a semiconductor device with a trench gate structure and further with remote contact structures in accordance with the present description.
Figure 4:
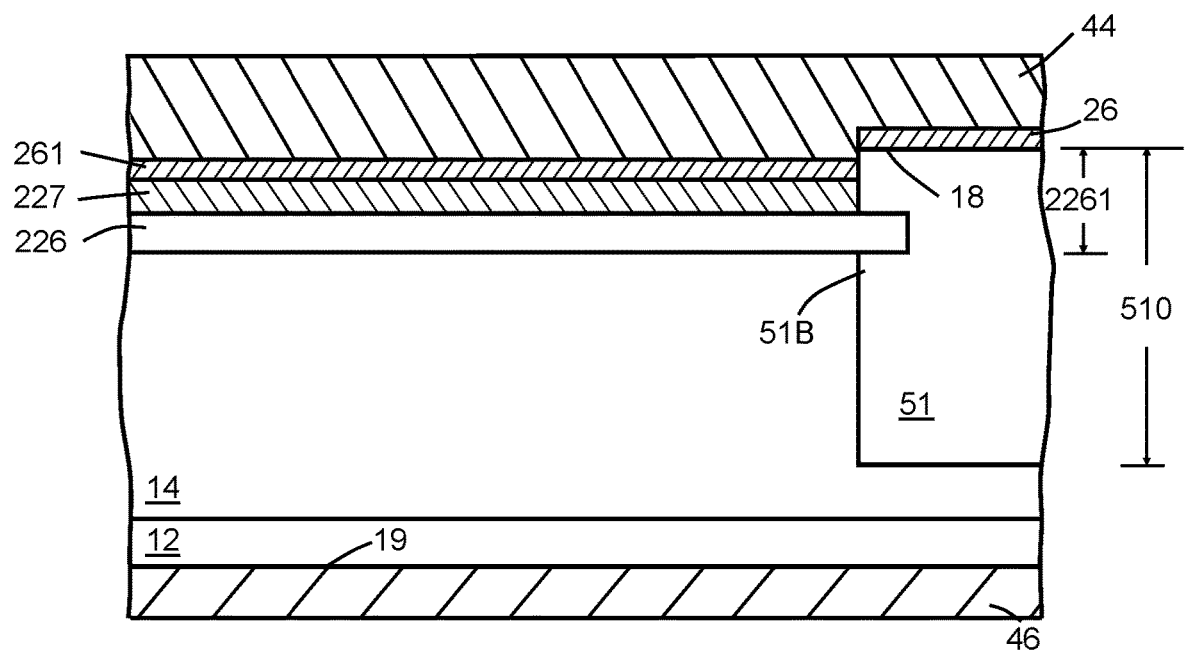
FIG. 4 illustrates a partial cross-sectional view of the semiconductor device of FIG. 2 taken along reference line 4A-4B.

FIG. 2 illustrates a top plan view of semiconductor device 10 with trench gate structures 13 further with remote gate contact structures 51 in accordance with the present description. FIG. 3 illustrates a partial cross-sectional view of semiconductor device 10 taken along reference line 3A-3B of FIG. 2; FIG. 4 illustrates a partial cross-sectional view of semiconductor device 10 taken along reference line 4A-4B of FIG. 2; and FIG. 5 illustrates a partial cross-sectional view of semiconductor device 10 taken along reference line 5A-5B of FIG. 2.

As illustrated in FIG. 2, semiconductor device 10 can include an active area 101 that includes trench gate structures 13. In accordance with the present description, gate contact structures 51, which can also be referred to as gate contact regions or remote contact regions, are distributed within active area 101 of semiconductor device 20. In some examples, gate contact structures 51 comprise doped regions that extend from major surface 18 of region of semiconductor material 11 inward to electrically connect with or contact doped regions 226 including, for example, below active trenches 23. When gate contact structures 51 comprise doped regions, they can comprise the same conductivity type as doped region 226 (such as P-type conductivity in the present example). Gate contact structures 51 are disposed within discrete portions of the mesa regions between adjacent trench gate structures 13. That is, gate contact structures 51 are not a continuous doped region that extend throughout active area 101. In some examples, gate contact structures 51 can be formed at the same time as termination structures are formed for semiconductor device 10, or can use some of the same process steps, which simplifies process integration.

In accordance with the present description, gate contact structures 51 are configured to provide selective conductivity modulation for semiconductor device 10. More particularly, gate contact structures 51 are configured to inject a lateral flow of minority carriers through doped regions 226 into semiconductor layer 14 during a forward bias operation to improve forward conduction, and are further configured to act as remote collector regions for collecting residual minority carriers or stored charge (Qrr) within semiconductor layer 14 when semiconductor device 10 is switched to an off-state. As a result, this improves recovery time ($t_{rr}$) and reduces switching losses.

Figure 5:
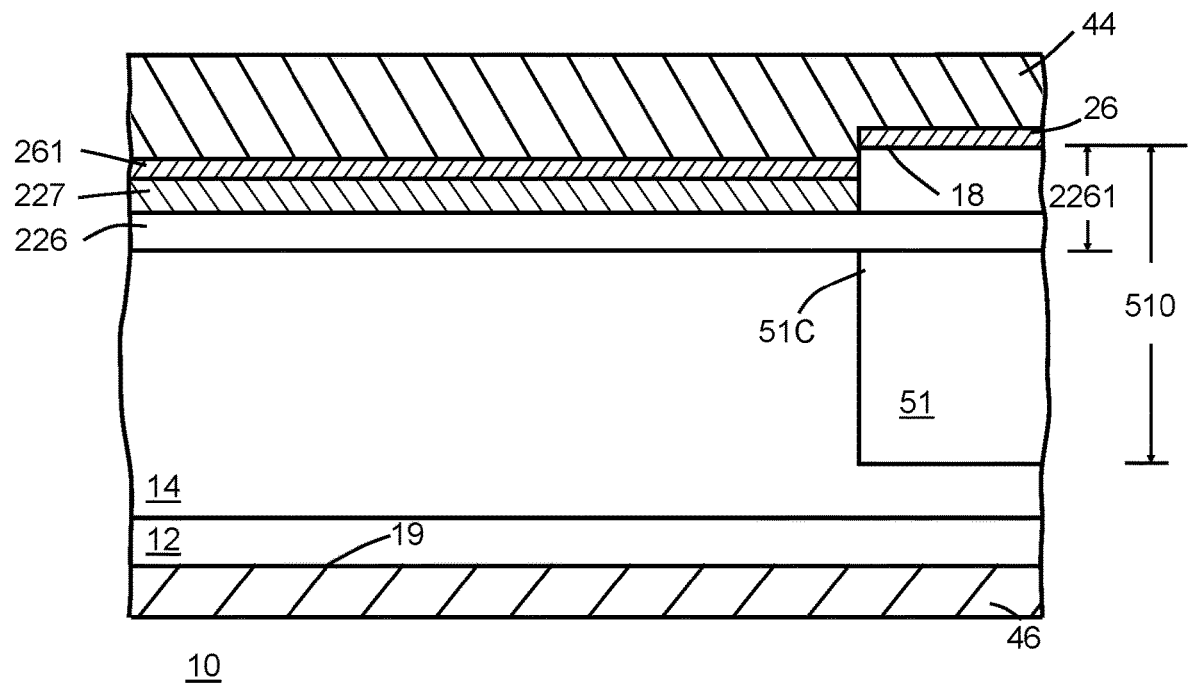
FIG. 5 illustrates a partial cross-sectional view of the semiconductor device of FIG. 2 taken along reference line 5A-5B.

As illustrated in FIGS. 3, 4 and 5, gate contact regions 51 extend from major surface 18 of region of semiconductor material 11 inward to a depth 510 and doped regions 226 can extend to a depth 2261 from major surface 18. In some examples, depth 510 is greater than depth 2261 so that gate contact regions 51 extend below doped regions 226. In some examples, gate contact regions 51 can be formed using patterning (e.g., photomasks, hard masks, etc.), doping (e.g., ion implantation, CVD, spin-on, etc.), and anneal or diffusion techniques.

FIG. 2 further illustrates alternative configurations of gate contact regions 51 designated as 51A, 51B, and 51C. A partial cross-section of semiconductor device 10 with gate contact region 51A is illustrated in FIG. 3. In some examples, gate contact region 51A comprises a generally rectangular shape in the top view of FIG. 2, such as a square shape. Other shapes are possible as well. In the present example, doped regions 226 abut or adjoin gate contact region 51A without substantially extending into gate region 51A. This configuration can be provided using, for example, masking techniques to control the location of the dopants used to form doped regions 226 and gate contact region 51A.

A partial cross-sectional view of semiconductor device 10 with gate contact region 51B is illustrated in FIG. 4. In some examples, gate contact region MB comprises a generally rectangular shape in the top view of FIG. 2, such as a square shape. Other shapes are possible as well. In the present example, portions of doped regions 226 overlap into or extend partially into a portion of gate contact region 51B without extending all the way laterally through gate contact region 51B. This configuration can be provided using, for example, masking techniques to control the location of the dopants used to form doped regions 226 and gate contact region 51B.

A partial cross-sectional view of semiconductor device 10 with gate contact region 51C is illustrated in FIG. 5. In some examples, gate contact region 51C comprises a generally rectangular shape in the top view of FIG. 2, such as a square shape. Other shapes are possible as well. In the present example, portions of doped regions 226 overlap and extend entirely across gate contact region 51C in a continuous manner. This configuration can be provided using, for example, masking techniques to control the location of the dopants used to form doped regions 226 and gate contact region 51C.

Figure 6:
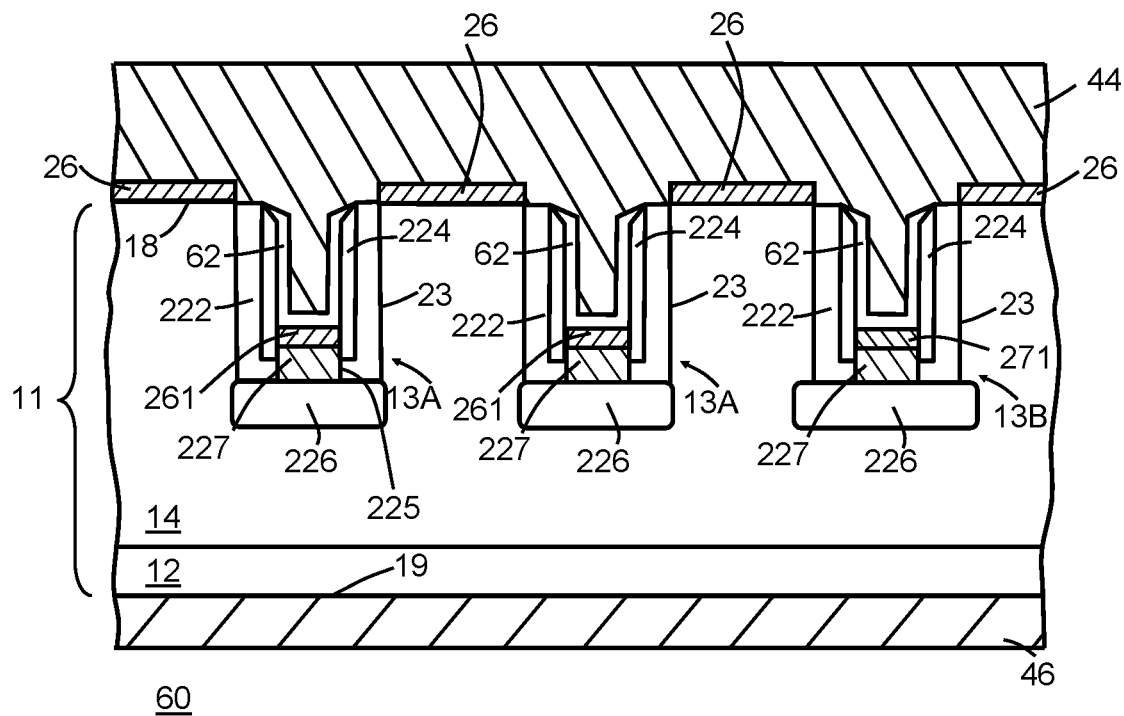
FIG. 6 illustrates a partial cross-sectional view of a semiconductor device in accordance with the present description.

FIG. 6 illustrates an enlarged partial cross-sectional view of an electronic device 60, a semiconductor device 60, or a trench Schottky rectifier 60 having trench gate structures 13A and 13B in accordance with the present description. Semiconductor device 60 is similar to semiconductor device 10 and the following description may not repeat similar details described previously.

In semiconductor device 60, two configurations of trench gate structures designated as trench gate structures 13A and 13B are illustrated. Similar to trench gate structures 13, trench gate structures 13A use contact regions 261. Trench gate structure 13B illustrates an alternative embodiment using a contact region 271, which comprises a material different than that used for contact regions 26 and 261. In some examples, contact region 271 can comprise a different Schottky material than contact regions 26. In some example, contact region 271 can comprise titanium silicide and contact regions 26 can comprise nickel-platinum silicide. This difference in material provides an additional degree of design freedom for semiconductor device 60.

Trench structures 13A and 13B are different than gate structures 13 in that they further comprise a dielectric liner 62 disposed between dielectric spacers 224, contact regions 261/271 and conductive layer 44. That is, dielectric liners 62 can be provided to electrically insulate contact regions 261/271 from conductive layer 44 in discrete locations within trench 23, or dielectric liners 62 can electrically insulate contact regions 261/271 from conductive layer 44 continuously within trenches 23 between gate contact regions 51. In this latter configuration, gate contact regions 51 provide the only electrical contact to doped regions 226. Dielectric liners 62 provide another degree of design freedom. In some examples, dielectric liners 62 can comprise an oxide, a nitride, other insulating materials as known to one of ordinary skill in the art, or combinations thereof. Dielectric liners 62 can be formed using oxidation, CVD, LPCVD, PECVD, or other processes as known to one of ordinary skill in the art.

In semiconductor device 60, doped regions 226 are illustrates as laterally wider than doped regions 226 illustrated with semiconductor device 10. In some examples, doped regions 226 can have substantially the same width as trenches 23 as illustrated with trench structures 13A. In other examples, doped regions 226 can be wider than trenches 23 as illustrated with trench gate structure 13B. It is understood that the multi-region semiconductor layer 14 of semiconductor device 10 can be used with semiconductor device 60 as well as any of the semiconductor devices described herein.

Figure 7:
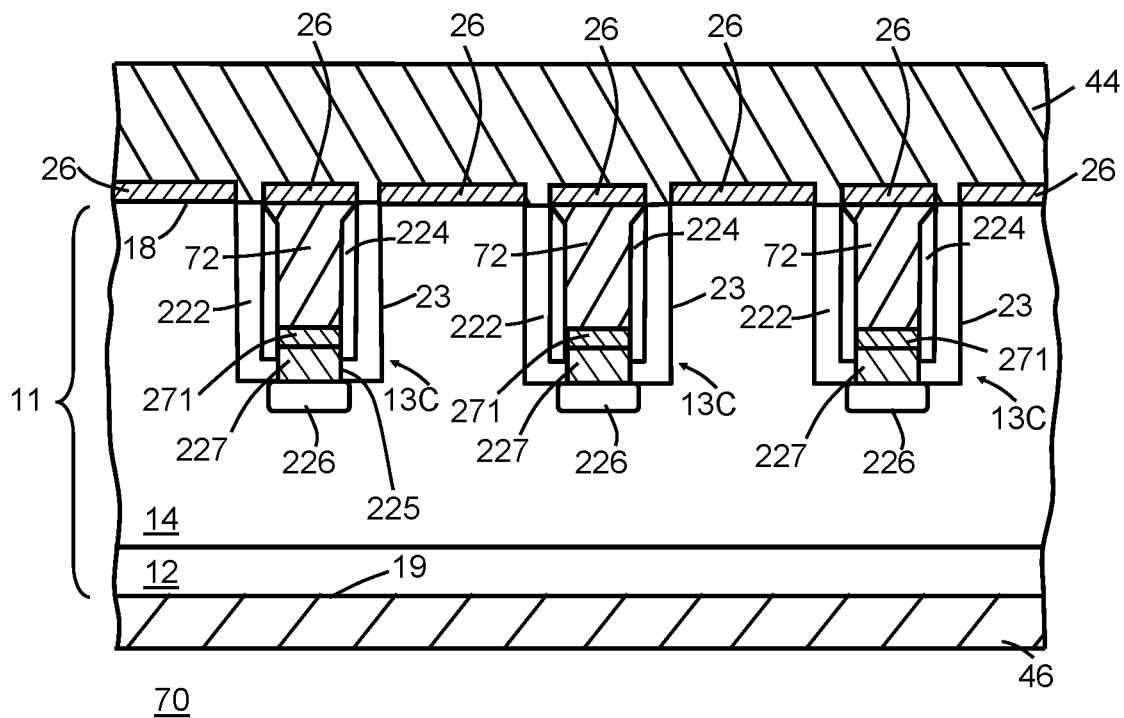
FIG. 7 illustrates a partial cross-sectional view of a semiconductor device in accordance with the present description.

FIG. 7 illustrates an enlarged partial cross-sectional view of an electronic device 70, a semiconductor device 70, or a trench Schottky rectifier 70 having trench gate structures 13C in accordance with the present description. Semiconductor device 70 is similar to semiconductor devices 10 and 60, and the following description may not repeat similar details described previously.

In semiconductor device 70, trench gate structures 13C include contact regions 271 as described previously. In addition, trench gate structures 13C include conductive regions 72 disposed within trenches 23. In some examples, conductive regions 72 can be substantially co-planar with major surface 18 of region of semiconductor material 11. In other examples, conductive regions 72 can be recessed within trenches 23 below major surface 18. In further examples, conductive regions 72 can extend out of trenches 23 above major surface 18. In some examples, conductive regions 72 can comprise polycrystalline semiconductor material, such as polysilicon and can be highly doped, lightly doped, or non-doped to provide another degree of design freedom. Processes, such as CVD, LPCVD, PECVD, other deposition processes can be used to provide conductive regions 72 together with planarization and patterning processes. When conductive regions 72 comprise polycrystalline semiconductor material, contact regions 26 can be provided above conductive regions 72 as illustrated in FIG. 7. In other examples, conductive regions 72 can comprise one or metals, such as tungsten plugs with appropriate liner and barrier materials. In other examples, contact regions 261 can be used with semiconductor device 70.

Figure 8:
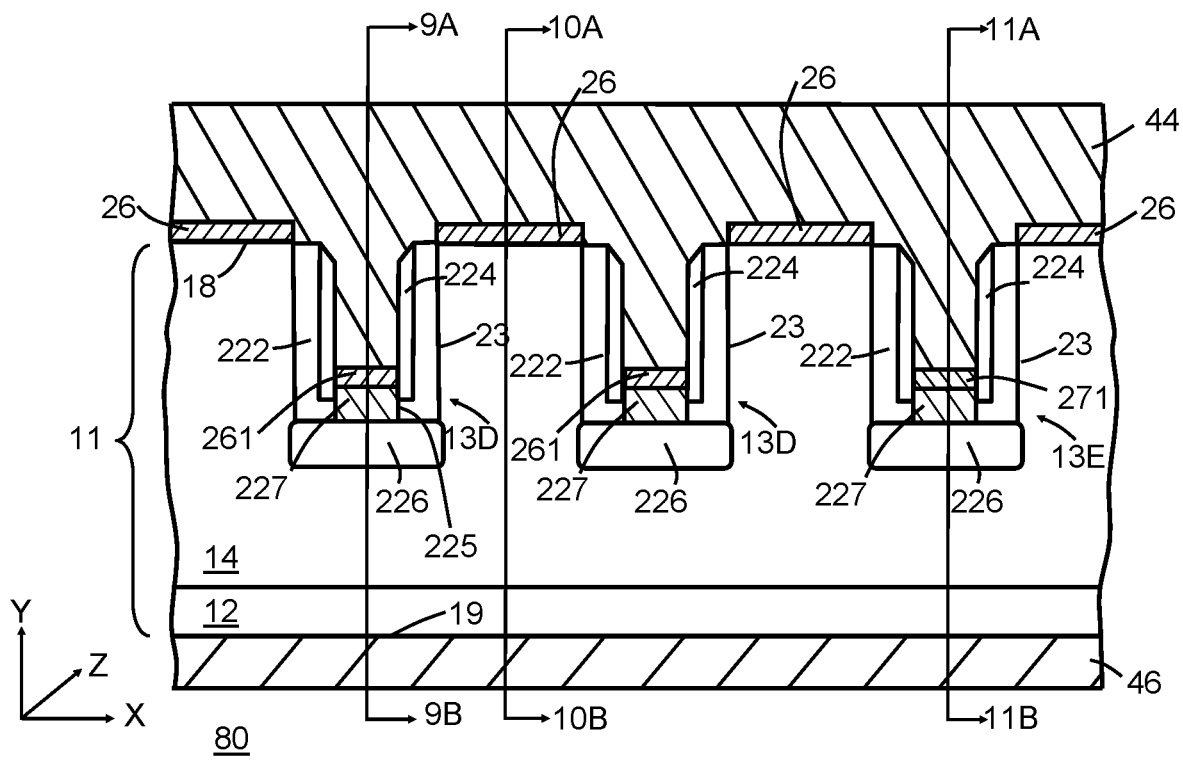
FIG. 8 illustrates a partial cross-sectional view of a semiconductor device in accordance with the present description.

FIG. 8 illustrates an enlarged partial cross-sectional view of an electronic device 80, a semiconductor device 80, or a trench Schottky rectifier 80 having trench gate structures 13D and 13E in accordance with the present description. Semiconductor device 80 is similar to semiconductor device 10 and the following description may not repeat similar details described previously. In semiconductor device 80, trench gate structures 13D are illustrated as example structures that include contact regions 261, which comprise a similar material as contact regions 26. In addition, trench gate structure 13E is illustrated as an example structure that includes contact regions 271, which comprise a material that is different that contact regions 26.

Figure 9:
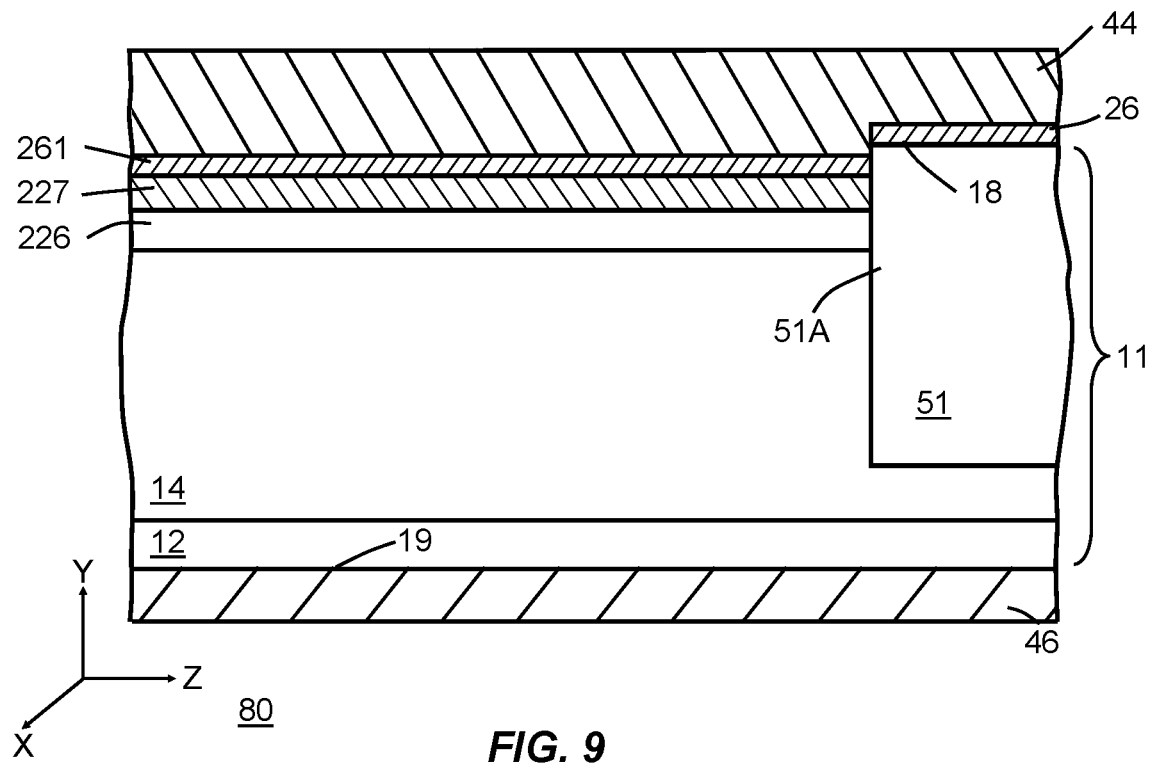
FIG. 9 illustrates a partial cross-sectional view of the semiconductor device of FIG. 8 taken along reference line 9A-9B.

FIG. 9 illustrates a partial cross-sectional view of semiconductor device 80 taken along reference line 9A-9B of FIG. 8. FIG. 9 illustrates where the central portion of trench gate structures 13D connects to a gate contact structure 51 in the z-direction of the cross-sectional view of FIG. 8. Trench gate structure 13D comprises contact region 261, recessed contact regions 227, and doped regions 226. In the example illustrated, gate contact structure 51 is configured similar to gate contact structure 51A illustrated in FIGS. 2 and 3.

Figure 10:
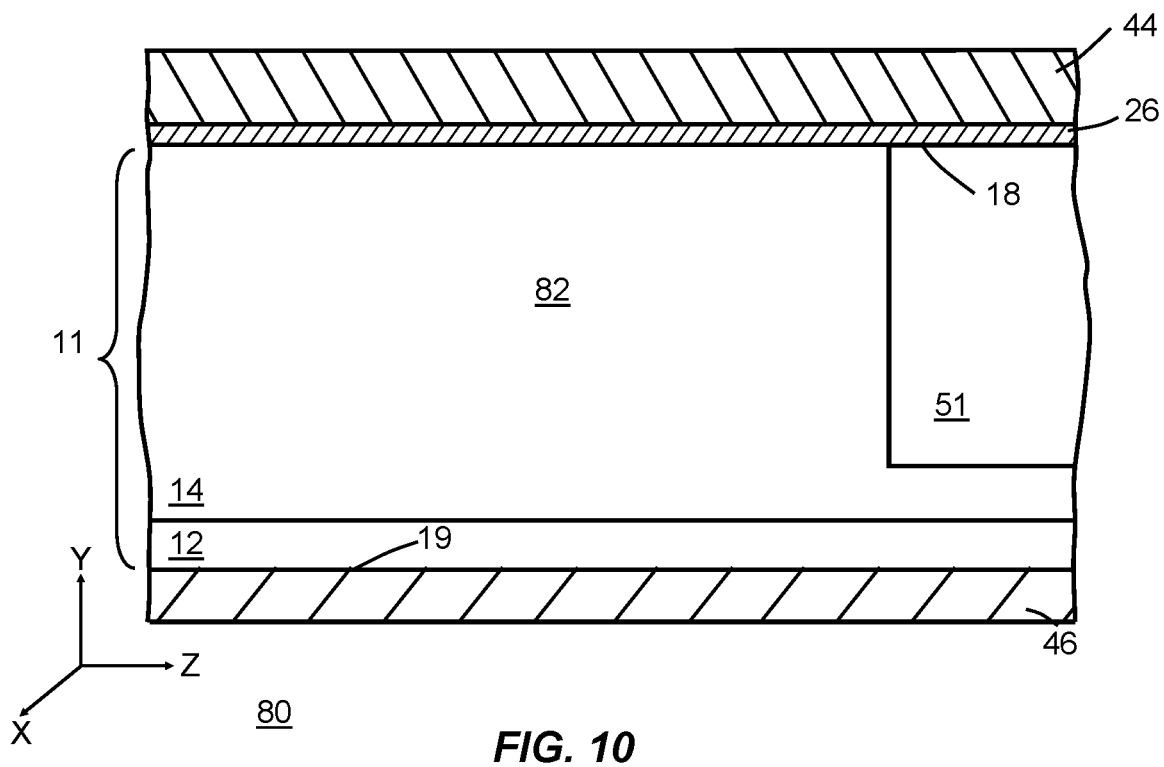
FIG. 10 illustrates a partial cross-sectional view of the semiconductor device of FIG. 8 taken along reference line 10A-10B.

FIG. 10 illustrates a partial cross-sectional view of semiconductor device 80 taken along reference line 10A-10B of FIG. 8. FIG. 10 illustrates where gate contact structure 51 extends into mesa portion 82 between adjacent trench structures 13D.

Figure 11:
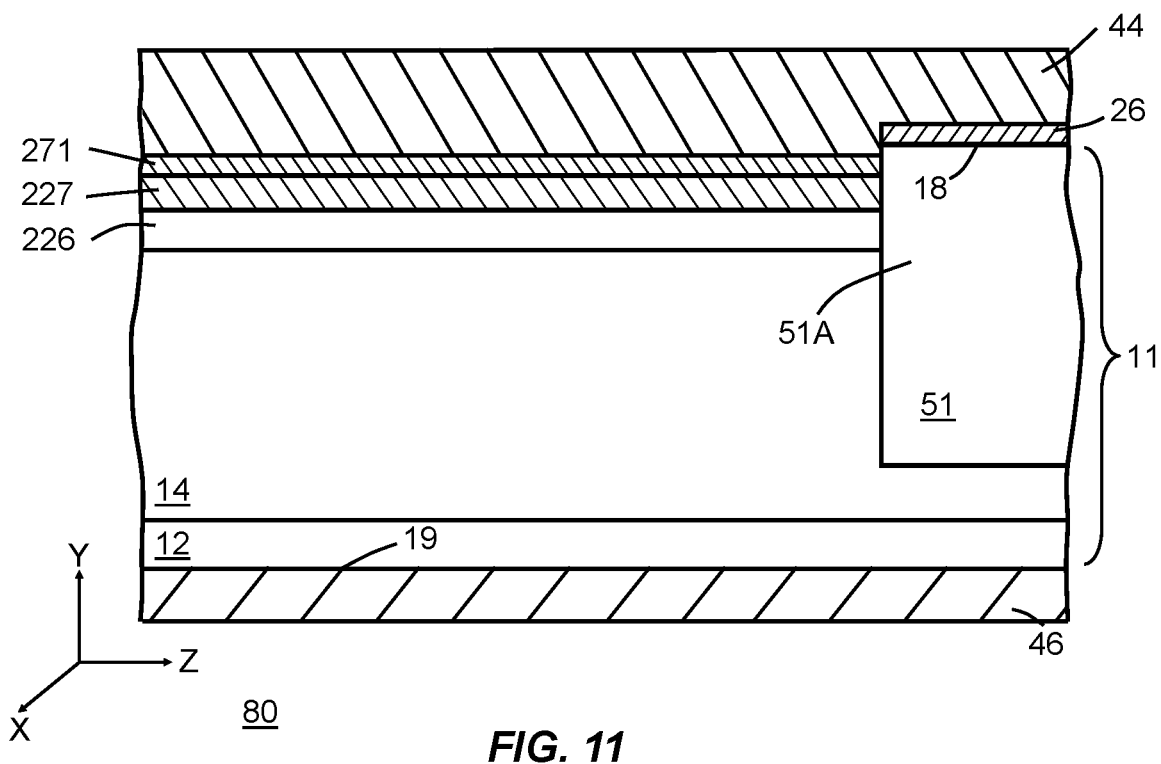
FIG. 11 illustrates a partial cross-sectional view of the semiconductor device of FIG. 8 taken along reference line 11A-11B.

FIG. 11 illustrates a partial cross-sectional view of semiconductor device 80 taken along reference line 11A-11B of FIG. 8. FIG. 11 illustrates where the central portion of trench gate structures 13E connects to a gate contact structure 51 in the z-direction of the cross-sectional view of FIG. 8. Trench gate structure 13E comprises contact region 271, recessed contact regions 227, and doped regions 226. In the example illustrated, gate contact structure 51 is configured similar to gate contact structure 51A illustrated in FIGS. 2 and 3.

Figure 12:
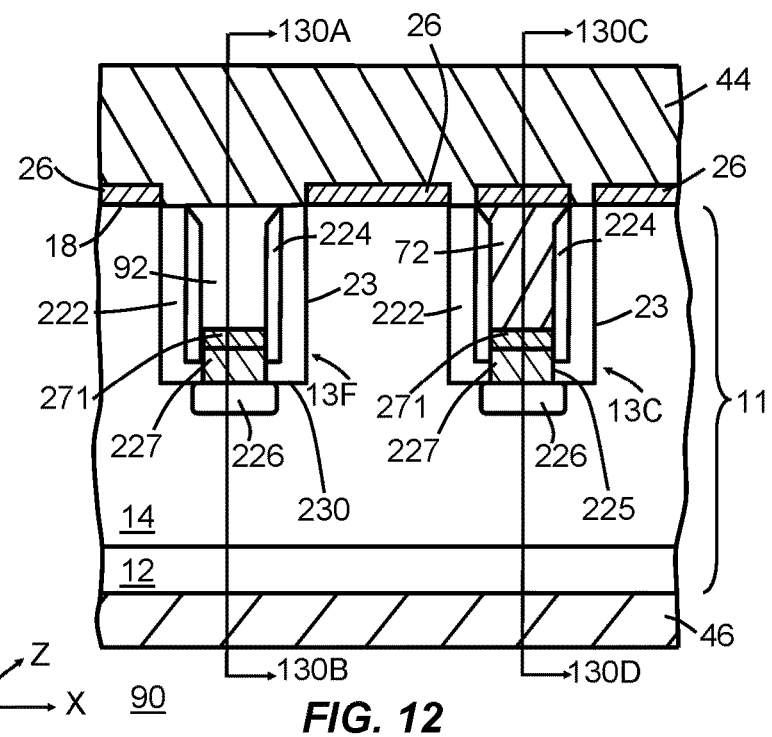
FIG. 12 illustrates a partial cross-sectional view of a semiconductor device in accordance with the present description.

FIG. 12 an enlarged partial cross-sectional view of an electronic device 90, a semiconductor device 90, or a trench Schottky rectifier 90 having trench gate structures 13C and 13F in accordance with the present description. Semiconductor device 90 can include either trench gate structure 13C or trench gate structure 13F or combinations of both. Semiconductor device 90 is similar to semiconductor devices 10 and 70 and the following description may not repeat similar details described previously. In semiconductor device 90, trench gate structure 13F is illustrated as an example structure that includes contact region 271, recessed contact region 227, and doped region 226. Trench gate structure 13F further includes dielectric region 92 disposed between contact region 271 and conductive layer 44. In some examples, dielectric region 92 comprises an oxide, a nitride, other insulative materials as known to one of ordinary skill in the art, or combinations thereof. Dielectric region 92 can be formed using CVD, PECVD, LPCVD, or other deposition or formation processes as known to one of ordinary skill the art. Dielectric region 92 can be patterned and/or planarized so that it is substantially co-planar with major surface 18 of region of semiconductor material 11. In other examples, dielectric region 92 can be recessed within trench 23 below major surface 18. In further examples, dielectric region 92 can extend outside of trench 23. In accordance with the present example, dielectric region 92 electrically isolates portions of contact region 271 and thus doped region 226 from conductive layer 44. This provide another degree of design freedom for controlling conductivity modulation.

Figure 13:
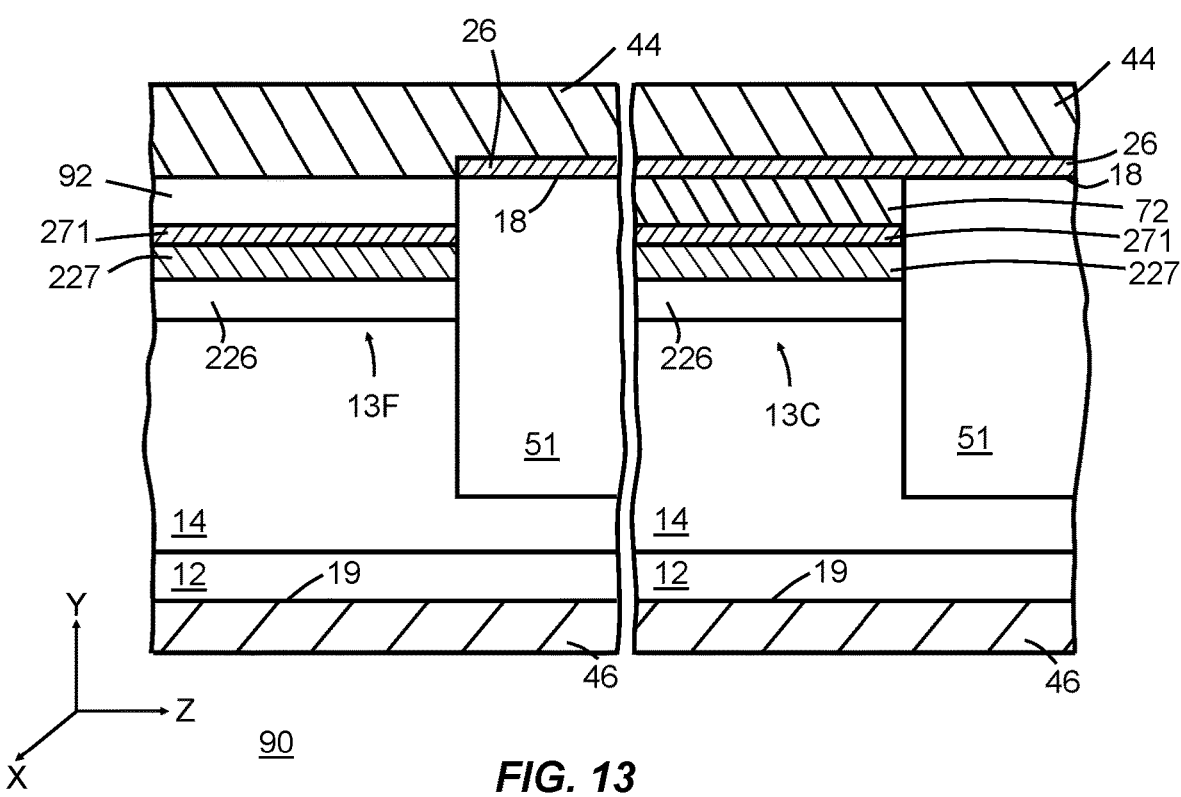
FIG. 13 illustrates partial cross-sectional views of the semiconductor device of FIG. 12 taken along references lines 130A-130B and 130C-130D.

FIG. 13 illustrates partial cross-sectional views of the semiconductor device 90 of FIG. 12 taken along references lines 130A-130B and 130C-130D of FIG. 12. FIG. 13 illustrates where the central portion of trench gate structure 13C connects to a gate contact structure 51 in the z-direction of the cross-sectional view of FIG. 12; and illustrates where the central portion of trench gate structure 13F connects to gate contact structure 51 in the z-direction of the cross-sectional view. In accordance with the present description, contact is made to doped region 226 in trench gate structure 13F only through gate contact structure 51 where gate contact structure 51 adjoins doped region 226 and recessed contact region 227. For trench gate structure 13C, contact is made to doped region 226 through both gate contact structure 51 and through recessed region 227, contact region 271, conductive region 72, contact region 26, and conductive layer 44.

Figure 14:
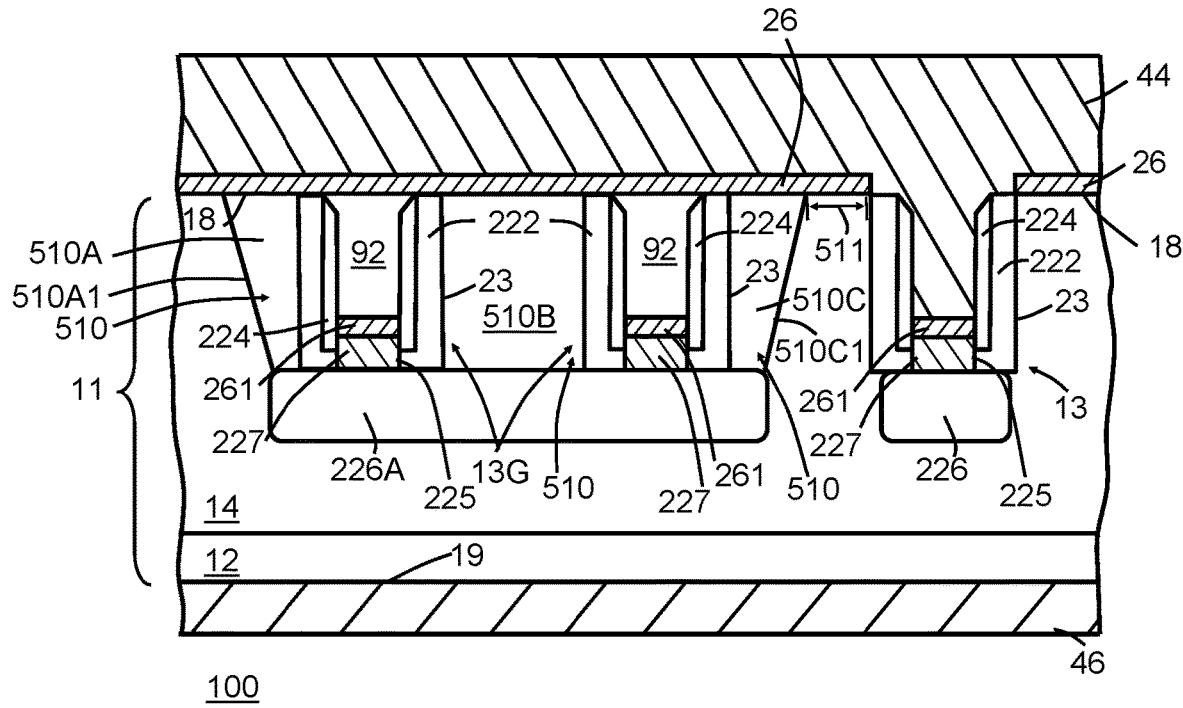
FIG. 14 illustrates a partial cross-sectional view of a semiconductor device in accordance with the present description.

FIG. 14 illustrates an enlarged partial cross-sectional view of an electronic device 100, a semiconductor device 100, or a trench Schottky rectifier 100 having trench gate structures 13 and 13G in accordance with the present description. Trench gate structure 13G is similar to trench gate structure 13F except that trench gate structure 13G comprises contact region 261. Semiconductor device 100 further comprises gate contact structure 510 having several portions. In the present example, gate contact structure 510 comprises a portion 510A, which adjoins a side surface of one of a pair of trench gate structures 13G; a portion 510B, which adjoins and extends between the pair of trench gate structures 13G; and a portion 510C, which adjoins a side surface of another one of the pair of trench gate structures 13G. In some examples, gate contact structure 510 comprises a P-type conductivity when semiconductor layer 14 comprises N-type conductivity. In some examples, a doped region 226A (which is similar to doped region 226) extends laterally across both trench gate structures 13G and that portion of semiconductor layer 14 between trench gate structures 13G.

In some examples, portion 510A has a side surface 510A1 and portion 510C has a side surface 510C1 that slope at an angle from, or are tapered with respect to, major surface 18. As illustrated in FIG. 14, trench gate structures 13G are embedded within a portion of gate contact structure 510 in the cross-sectional view.

Portion 510C of gate contact structure 510 forms a lateral PN junction with semiconductor layer 14 proximate to trench gate structure 13. The lateral PN junction can be spaced a distance 511 from trench gate structure 13. The lateral PN junction and distance 511 provide additional degrees of design freedom. For example, the lateral PN junction assists in suppressing leakage by pinching of the Schottky surface by a lateral depletion effect in selected regions where portion 510C is located. Additionally, the lateral PN junction can increase and thereby improve contact between conductive layer 44 and gate contact structure 510, which can further improve Vf and Qrr performance. Anode metal for both sides of the deep remote P that would aid in better Vf/Switching control.

Figure 15:
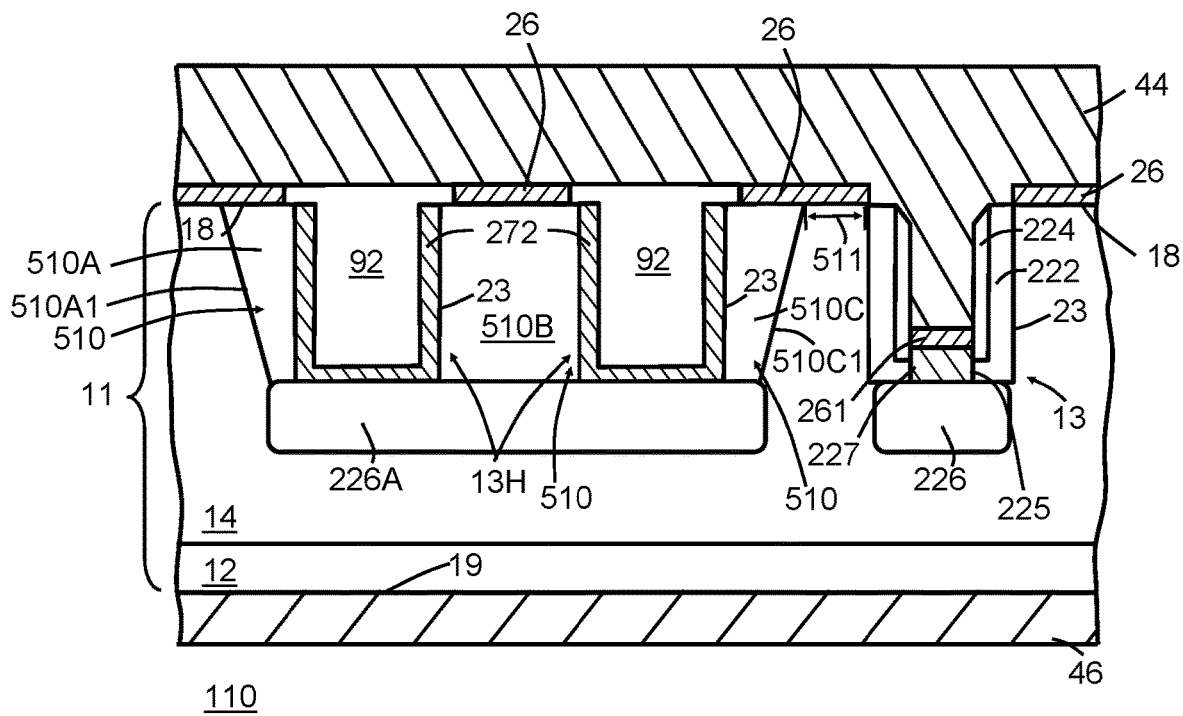
FIG. 15 illustrates a partial cross-sectional view of a semiconductor device in accordance with the present description.

FIG. 15 illustrates an enlarged partial cross-sectional view of an electronic device 110, a semiconductor device 110, or a trench Schottky rectifier 110 having trench gate structures 13 and 13H in accordance with the present description. Semiconductor device 110 is similar to semiconductor device 100 and the following description will not repeat similar details described previously. In semiconductor device 110, trench gate structures 13H comprise contact regions 272 that extend along sidewall and lower surfaces of trenches 23. Contact regions 272 can comprise similar materials to contact regions 261 and 271. Trench gate structures 13H further include dielectric regions 92 as described previously. In the present example, dielectric regions 92 extend out of trenches 23 and partially overlap major surface 18 above contact regions 272, which are on the sidewall portions of trenches 23. More particularly, in some examples, contact regions 272 are electrically insulated from contact regions 26 and conductive layer 44 by dielectric regions 92. In the present example, contact is made to contact regions 272 and doped regions 226/226A through gate contact structure 510.

Figure 16:
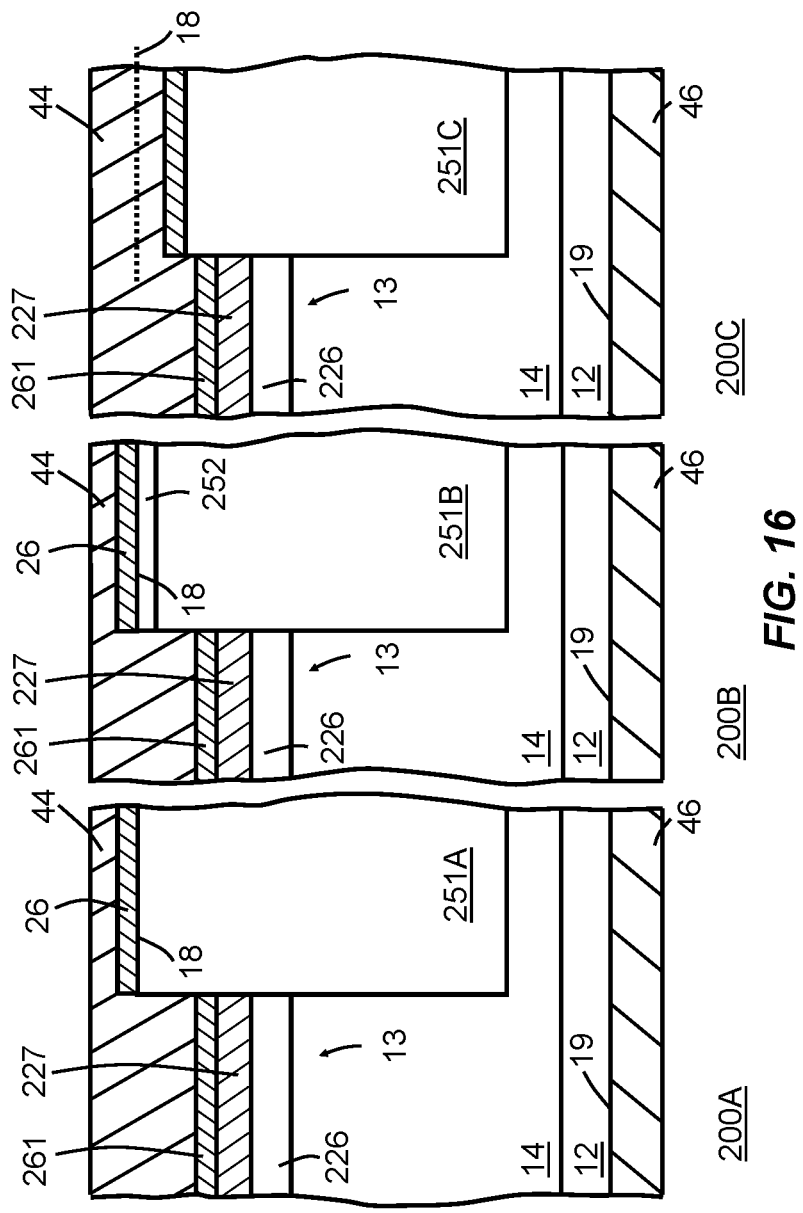
FIG. 16 illustrates partial cross-sectional views of semiconductor devices in accordance with the present description.

FIG. 16 illustrates enlarged partial cross-sectional view of electronic devices 200A, 200B, and 200C, semiconductor devices 200A, 200B, and 200C, or trench Schottky rectifiers 200A, 200B, and 200C having gate contact structures 251A, 251B, and 251C in accordance with the present description. Semiconductor devices 200A, 200B, and 200C are illustrated using trench gate structures 13, but it is understood that any of the trench gate structures described herein can be used with gate contact structures 251A, 251B, or 251C. It if further understood that a semiconductor device in accordance with the description can include any one of gate contact structures 251A, 251B, or 251C, or any combination of two gate contact structures, or all three.

Gate contact structure 251A is similar to gate contact structure 51, which makes contact with contact region 26 proximate to or adjoining major surface 18. Gate contact 251B is an example that further comprises a surface enhancement region 252 provided proximate to major surface 18. Surface enhancement region 252 comprises a P-type conductivity, and in some examples has a higher dopant concentration than gate contact region 251B. Gate contact structure 251C is an example of a gate contact structure that recessed below major surface 18. In some examples, contact region 26 makes contact to gate contact region 251C below major surface 18.

Figure 17:
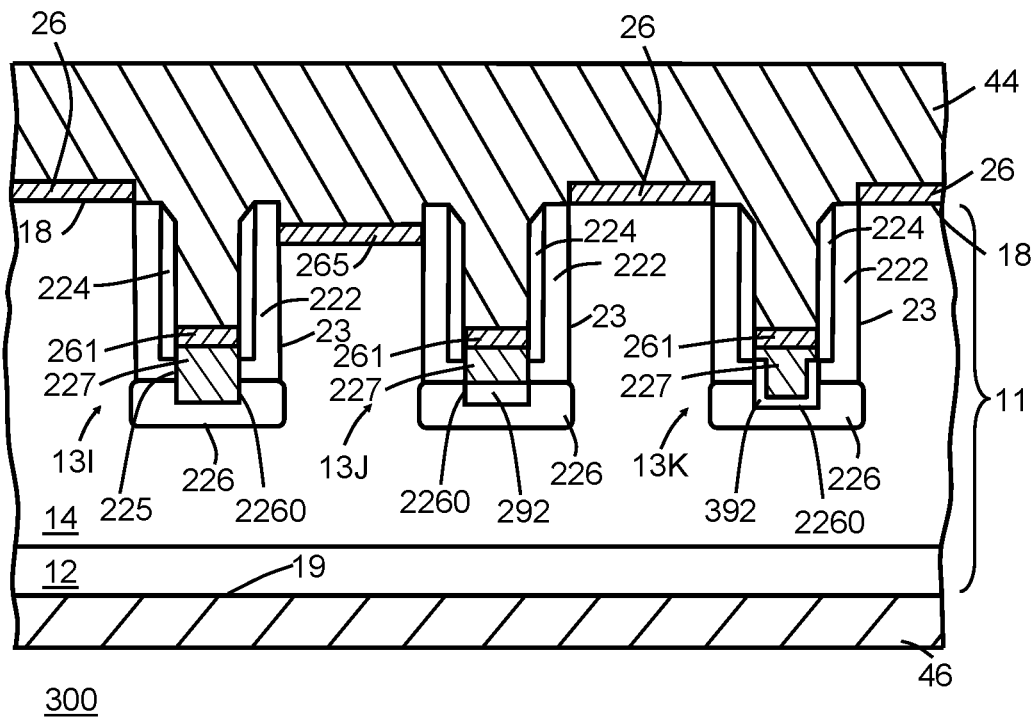
FIG. 17 illustrates a partial cross-sectional view of semiconductor devices in accordance with the present description.

FIG. 17 illustrates a partial cross-sectional view of an electronic device 300, semiconductor device 300, or trench Schottky rectifier 300 having trench gate structures 13I, 13J, and 13K in accordance with the present description. Semiconductor device 300 is similar to semiconductor device 10 and the following description may not repeat similar details described previously. It is understood that a semiconductor device in accordance with the description can include any one of trench gate structures 13I, 13J, or 13K, or any combination of two trench gate structures 13I, 13J, or 13K, or all three.

In some examples, trench gate structure 13I comprises active trench 23, dielectric structure 222, dielectric spacers 224, recessed contact 227, and contact region 261. In accordance with the present description, a recess 2260 is formed within doped region 226 below trench 23 so that recessed contact 227 extends into doped region 226 as generally illustrated in FIG. 17. This configuration provides, among other things, more contact area between recessed contact 227 and doped region 226.

In some examples, trench gate structure 13J comprises active trench 23, dielectric structure 222, dielectric spacers 224, recessed contact 227, and contact region 261. In addition, trench gate structure 13J comprises recess 2260, which is filled with a dielectric structure 292 that electrically isolates recessed contact 227 from doped region 226. Dielectric structure 292 can comprise materials similar to dielectric structure 92 described previously. In some examples, dielectric structure 292 can extend the length of trench 23 between gate contact structures 51. In other examples, multiple dielectric structures 292 can be used and interspersed within active trench 23. That is, dielectric structures 292 can be combined with recessed contacts 227 as described with trench gate structure 13I within an active trench 23. In other examples, one active trench can be configured one way and another active trench can be configured a different way. This provides additional degrees of design freedom for conductivity modulation.

In some examples, trench gate structure 13K comprises active trench 23, dielectric structure 222, dielectric spacers 224, recessed contact 227, and contact region 261. In addition, trench gate structure 13K comprises recess 2260. In the present example, a dielectric structure 392 lines sidewall and lower surfaces of recess 2260 to electrically isolate recessed contact 227 from doped region 226, Dielectric structure 392 can comprise materials similar to dielectric structure 92 described previously. In some examples, dielectric structure 392 can extend the length of trench 23 between gate contact structures 51. In other examples, multiple dielectric structures 392 can be used and interspersed within active trench 23. That is, dielectric structures 392 can be combined with recessed contacts 227 as described with trench gate structure 13I within an active trench 23. In other examples, one active trench can be configured one way and another active trench can be configured a different way. This provides additional degrees of design freedom for conductivity modulation.

In some examples, semiconductor device 300 can include one or more contact regions 265, which are recessed inward into semiconductor layer 14 from major surface 18.

Figure 18:
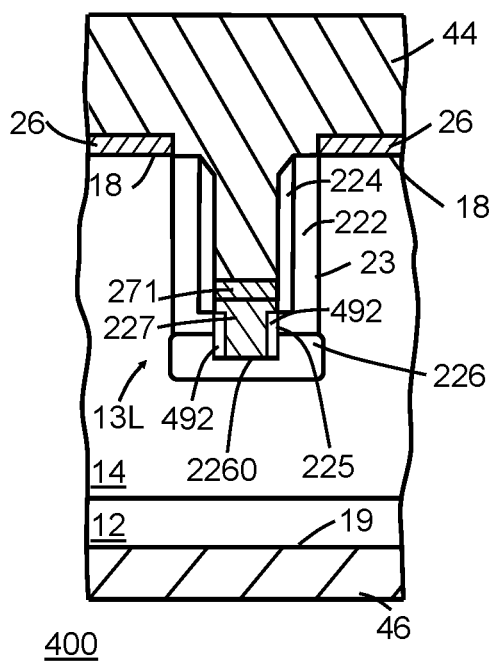
FIG. 18 illustrates a partial cross-sectional view of a semiconductor device in accordance with the present description.

FIG. 18 illustrates a partial cross-sectional view of an electronic device 400, semiconductor device 400, or trench Schottky rectifier 400 having a trench gate structure 13L in accordance with the present description. Semiconductor device 400 is similar to semiconductor device 10 and the following description may not repeat similar details described previously. In some examples, trench gate structure 13L comprises active trench 23, dielectric structure 222, dielectric spacers 224, recessed contact 227, and contact region 271. In addition, trench gate structure 13L comprises recess 2260 with dielectric spacers 492 disposed along sidewall surfaces of recess 2260. Dielectric spacers 492 can comprise material similar to dielectric spacers 224 or dielectric structure 92 described previously. Recessed contact 227 makes contact with doped region along the lower surface of recess 2260 as generally illustrated in FIG. 18. In some examples, dielectric spacers 492 can extend the length of trench 23 between gate contact structures 51. In other examples, dielectric spacers 492 can be combined with dielectric structures 392 as described with trench gate structure 13K within an active trench 23. In other examples, one active trench can be configured one way and another active trench can be configured a different way. This provides additional degrees of design freedom for conductivity modulation.

It is understood that any of the gate contact structure and the trench gate structures described herein can be included and/or excluded to provide other semiconductor device configurations.

In view of all of the above, it is evident that a novel structure is disclosed. Included, among other features, is a semiconductor device having trench gate structures with doped regions formed below the trench gate structures. Remote gate contact structures provide electrical connection to the doped regions. The remote gate contact structures provide a means for conductivity modulation during device operation to improve forward operating performance and switching characteristics. In some examples, one or more of the trench gate structures may provide contact to the doped region within the active trenches as described herein to provide additional degrees of design freedom. In some examples, the remote contact structures can surround portions of more than one of the trench gate structures.

While the subject matter of the invention is described with specific preferred examples, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device structure, comprising:
a region of semiconductor material comprising a first conductivity type, a first major surface, and a second major surface opposite to the first major surface;
a first trench gate structure comprising:
a first trench extending from the first major surface into the region of semiconductor material;
a first dielectric structure over sidewall surfaces and a portion of a lower surface of the first trench, wherein the first dielectric structure comprises a first opening adjacent to the lower surface of the first trench;
a first recessed contact extending through the first opening; and
a first contact region over the first recessed contact within the first trench, wherein the first recessed contact and the first contact region comprise different materials;
a first doped region comprising a second dopant conductivity type opposite to the first conductivity type in the region of semiconductor material spaced apart from the first major surface and below the first trench; and
a gate contact region in the region of semiconductor material electrically coupled to the first doped region, wherein:
the gate contact region comprises a second doped region of the second conductivity type; and
the first doped region and the second doped region contact at a side of the second doped at a location below the first major surface.

2. The structure of claim 1, further comprising:
a second contact region electrically coupled to gate contact region; and
a conductive layer electrically coupled to the first contact region and the second contact region, wherein:
the first contact region and the second contact region comprise a Schottky barrier material.

3. The structure of claim 1, wherein:
portions of the first recessed contact are electrically coupled to the first doped region through the opening in the first dielectric structure.

4. The structure of claim 1, wherein:
portions of the first recessed contact are electrically decoupled from the first doped region.

5. The structure of claim 1, wherein:
the second doped region is a patterned region within a discrete portion of the region of semiconductor material laterally adjacent to the first gate trench structure.

6. The structure of claim 1, further comprising:
dielectric spacers along sidewall surfaces of the first dielectric structure, wherein:
the dielectric spacers are interposed between the first dielectric structure and the first contact region.

7. The structure of claim 6, further comprising:
a conductive layer electrically coupled to the first contact region, wherein:
the conductive layer contacts the first contact region at a location above a lower surface of the first trench.

8. The structure of claim 1, wherein:
the first recessed contact comprises a polycrystalline semiconductor material; and
the first contact region comprises a Schottky barrier material.

9. The structure of claim 8, wherein:
the polycrystalline semiconductor material is an intrinsic material.

10. The structure of claim 8, wherein the polycrystalline semiconductor material is lightly doped to have a dopant concentration less than about $1.0 \times 10^{18}$ atoms/cm$^3$.

11. The structure of claim 1, wherein:
the region of semiconductor material comprises:
a substrate; and
a semiconductor layer over the substrate;
the semiconductor layer defines the first major surface; and
the semiconductor layer has a dopant profile that changes over its depth inward from the first major surface.

12. The structure of claim 11, wherein:
the semiconductor layer has a plurality of regions; and
each region has a different dopant concentration.

13. The structure of claim 1, wherein:
the first doped region laterally overlaps into the gate contact region.

14. The structure of claim 1, wherein:
the gate contact region extends into the region of semiconductor material to a depth that is greater than that of the first doped region.

15. A semiconductor device structure, comprising:
a region of semiconductor material comprising an active region, a first conductivity type, a first major surface, and a second major surface opposite to the first major surface;
trench gate structures comprising:
trenches extending from the first major surface into the region of semiconductor material;
first dielectric structures over sidewall surfaces and a portion of a lower surface of each trench, wherein each first dielectric structure comprises an opening adjacent to the lower surface;
recessed contacts extending through the openings; and
first contact regions over the recessed contacts within the trenches, wherein the recessed contacts and the first contact regions comprise different materials;
doped regions comprising a second dopant conductivity type opposite to the first conductivity type in the region of semiconductor material spaced apart from the first major surface and below the trenches; and
gate contact regions in the active region of region of semiconductor material electrically coupled to the doped regions, wherein:
at least first portions of the recessed contacts are electrically coupled to the doped regions; and
the first contact regions comprise a Schottky barrier material.

16. The structure of claim 15, wherein:
the recessed contacts are a lightly doped material with a dopant concentration less than about $1.0 \times 10^{18}$ atoms/cm$^3$.

17. The structure of claim 15, wherein:
the recessed contacts are an intrinsic material.

18. The structure of claim 15, wherein:
the doped regions laterally extend into the gate contact regions.

19. The structure of claim 15, wherein:
the doped regions each have a first lateral width;
the trench gate structures each have a second lateral width; and
the second lateral width is greater than the first lateral width.

20. A method of forming a semiconductor device comprising:
providing a region of semiconductor material comprising an active region, a first conductivity type, a first major surface, and a second major surface opposite to the first major surface;
providing trench gate structures comprising:
trenches extending from the first major surface into the region of semiconductor material;
first dielectric structures over sidewall surfaces and a portion of a lower surface of each trench, wherein each first dielectric structure comprises an opening adjacent to the lower surface;
recessed contacts extending through the openings; and
first contact regions over the recessed contacts within the trenches, wherein the recessed contacts and the first contact regions comprise different materials;
providing doped regions comprising a second dopant conductivity type opposite to the first conductivity type in the region of semiconductor material spaced apart from the first major surface and below the trenches; and
providing gate contact regions in the active region of region of semiconductor material electrically coupled to the doped regions, wherein:
at least first portions of the recessed contacts are electrically coupled to the doped regions.

* * * * *